(12) United States Patent
Kim et al.

(10) Patent No.: US 9,159,737 B2
(45) Date of Patent: Oct. 13, 2015

(54) SEMICONDUCTOR DEVICES INCLUDING DEVICE ISOLATION STRUCTURES AND METHOD OF FORMING THE SAME

(71) Applicant: Samsung Electronics Co., Ltd., Suwon-si (KR)

(72) Inventors: Daewoong Kim, Hwaseong-si (KR); Junkyu Yang, Seoul (KR); HongSuk Kim, Yongin-si (KR); Tae-Jong Han, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/447,746

(22) Filed: Jul. 31, 2014

(65) Prior Publication Data

US 2015/0001609 A1    Jan. 1, 2015

Related U.S. Application Data

(63) Continuation of application No. 13/592,822, filed on Aug. 23, 2012, now Pat. No. 8,809,937.

(30) Foreign Application Priority Data

Sep. 1, 2011    (KR) .................. 10-2011-0088583

(51) Int. Cl.
*H01L 29/00*        (2006.01)
*H01L 27/115*       (2006.01)
*H01L 21/764*       (2006.01)

(52) U.S. Cl.
CPC ........ *H01L 27/11521* (2013.01); *H01L 21/764* (2013.01)

(58) Field of Classification Search
CPC ..................................................... H01L 21/764
USPC ........................................................ 438/422
See application file for complete search history.

(56) References Cited

U.S. PATENT DOCUMENTS

| | | | |
|---|---|---|---|
| 5,098,856 A | 3/1992 | Beyer et al. | |
| 7,038,289 B2 | 5/2006 | Marty et al. | |
| 7,338,896 B2 | 3/2008 | Vanhaelemeersch et al. | |
| 7,396,732 B2 | 7/2008 | Kunnen | |
| 7,400,024 B2 | 7/2008 | Kunnen | |
| 7,560,344 B2 | 7/2009 | Kim et al. | |
| 7,704,851 B2 | 4/2010 | Kim | |

(Continued)

FOREIGN PATENT DOCUMENTS

| | | |
|---|---|---|
| JP | 2006173551 | 6/2006 |
| JP | 2008066689 | 3/2008 |

(Continued)

OTHER PUBLICATIONS

"Semiconductor Devices Including Device Isloation Structures and Method of Forming the Same" Specification, Drawings, Claims and Prosecution History, of U.S. Appl. No. 13/592,822, filed Aug. 23, 2012, by inventor(s).

*Primary Examiner* — Chandra Chaudhari
(74) *Attorney, Agent, or Firm* — Onello & Mello, LLP.

(57) ABSTRACT

Provided are semiconductor devices and methods of forming the same. A device isolation structure in the semiconductor device includes a gap region. A dielectric constant of a vacuum or an air in the gap region is smaller than a dielectric constant of an oxide layer and, as a result coupling and attendant interference between adjacent cells may be reduced.

10 Claims, 17 Drawing Sheets

(56) References Cited

U.S. PATENT DOCUMENTS

| | | | |
|---|---|---|---|
| 7,800,155 B2 * | 9/2010 | Matsuno | 257/315 |
| 2006/0131655 A1 | 6/2006 | Kunnen | |
| 2006/0223301 A1 | 10/2006 | Vanhaelemeersch et al. | |
| 2006/0258077 A1 | 11/2006 | Kunnen | |
| 2007/0045769 A1 | 3/2007 | Bain et al. | |
| 2008/0057666 A1 | 3/2008 | Kim | |
| 2011/0163367 A1 | 7/2011 | Kang et al. | |
| 2011/0309425 A1 | 12/2011 | Purayath et al. | |

FOREIGN PATENT DOCUMENTS

| | | |
|---|---|---|
| JP | 2009267208 | 11/2009 |
| JP | 2010087160 | 4/2010 |
| KR | 2001063713 | 7/2001 |
| KR | 2002061062 | 7/2002 |
| KR | 100829368 | 6/2004 |
| KR | 2004054100 | 6/2004 |
| KR | 100880310 | 3/2008 |
| KR | 2009130682 | 12/2009 |

* cited by examiner

SEMICONDUCTOR DEVICES INCLUDING DEVICE ISOLATION STRUCTURES AND METHOD OF FORMING THE SAME

CROSS-REFERENCE TO RELATED APPLICATIONS

This application is a continuation application of U.S. patent application Ser. No. 13/592,822, filed Aug. 23, 2012, which claims priority under 35 U.S.C. §119 to Korean Patent Application No. 10-2011-0088583, filed on Sep. 1, 2011, the entirety of which is incorporated by reference herein.

BACKGROUND

Inventive concepts relate to semiconductor devices and methods of forming the same.

Integrated circuits have, to a large extent, followed Moore's law of increasing device density for decades. Increased density provides significant benefits to end-users in price, performance, portability, and reliability. However, as integrated circuits continue to pack more and more circuitry into a given area, some mechanisms threaten to diminish the devices' reliability. For example, as device density increases, adjacent cells may interfere with one another through a coupling mechanism. A system and method that counteracts such interference would be highly desirable.

SUMMARY

Exemplary embodiments in accordance with principles of inventive concepts may provide high integrated semiconductor devices capable of minimizing interference between cells adjacent to each other.

Exemplary embodiments in accordance with principles of inventive concepts may provide methods of forming high integrated semiconductor devices capable of minimizing interference between cells adjacent to each other.

In one aspect of exemplary embodiments in accordance with principles of inventive concepts, a semiconductor device may include: a substrate; and a device isolation structure disposed in the substrate to define an active region. The device isolation structure includes a lower insulating pattern, an upper insulating pattern, and a gap region between the lower insulating pattern and the upper insulating pattern.

In some exemplary embodiments in accordance with principles of inventive concepts, the lower insulating pattern may include silicon oxide.

In other exemplary embodiments in accordance with principles of inventive concepts, the upper insulating pattern may include a filling insulating recess pattern and spacer recess patterns positioned on both sidewalls of the filling insulating recess pattern.

Exemplary embodiments in accordance with principles of inventive concepts, the device may further include: floating gate patterns disposed at both sides of the device isolation structure, respectively; a control gate line disposed on the floating gate patterns to extend onto the upper insulating pattern; and a blocking insulating pattern interposed between the control gate line and the floating gate patterns. A bottom surface of the filling insulating recess pattern may be higher than a bottom surface of the floating gate pattern and is lower than a bottom surface of the blocking insulating pattern.

In exemplary embodiments in accordance with principles of inventive concepts, a top surface of the filling insulating recess pattern may be substantially coplanar with a top surface of the spacer recess pattern.

In exemplary embodiments in accordance with principles of inventive concepts, a top surface of the upper insulating pattern may be lower than a top surface of the floating gate pattern.

In exemplary embodiments in accordance with principles of inventive concepts, the control gate line may have a line shape extending in a first direction, and the lower insulating pattern may have a line shape extending in a second direction crossing the first direction.

In exemplary embodiments in accordance with principles of inventive concepts, the floating gate pattern may have an island shape disposed under the control gate line, and the upper insulating pattern may have an island shape disposed between neighboring floating gate patters.

In exemplary embodiments in accordance with principles of inventive concepts, the device may further include; an interlayer insulating layer disposed on the control gate line. The interlayer insulating layer may fill a space between neighboring upper insulating patterns to provide a sidewall of the gap region.

In another aspect of exemplary embodiments in accordance with principles of inventive concepts, a method of forming a semiconductor device may include: forming a mask structure on a semiconductor substrate; forming a trench in the semiconductor substrate using the mask structure as an etch mask; forming a lower insulating pattern covering a bottom of the trench; forming a sacrificial layer on the lower insulating pattern; forming a spacer line pattern on a sidewall of the mask structure to expose a portion of a top surface of the sacrificial layer; selectively removing the exposed sacrificial layer to form a gap region; and forming a filling insulating layer covering a sidewall of the spacer line pattern and providing a top surface of the gap region.

In exemplary embodiments in accordance with principles of inventive concepts, the sacrificial layer may be formed of a material having an etch selectivity with respect to the lower insulating pattern and the spacer line pattern. The lower insulating pattern may be formed using Tonen Silazene (TOSZ), and the sacrificial layer may be formed of a spin on hard mask layer or an amorphous silicon layer.

In exemplary embodiment of a method of forming a semiconductor device in accordance with principles of inventive concepts the method includes forming a floating gate layer pattern extending in a first direction on a semiconductor substrate; forming a trench in a second direction through the gate layer pattern and into the substrate, thereby forming floating gate layer islands; forming a lower insulation layer pattern on the bottom of the trench; and forming a covered-gap volume over the lower insulation pattern and between the floating gate pattern islands.

In exemplary embodiments in accordance with principles of inventive concepts the forming of a lower insulation layer pattern includes employing a lower insulation layer material having good step coverage characteristics.

In exemplary embodiments in accordance with principles of inventive concepts the lower insulating pattern is formed using Tonen Silazene (TOSZ).

In exemplary embodiments in accordance with principles of inventive concepts forming a covered-gap volume over the lower insulation pattern and between the floating gate pattern islands includes: forming a sacrificial layer over the floating gate pattern that partially fills the trench and forming a spacer line pattern over the sacrificial layer.

In exemplary embodiments in accordance with principles of inventive concepts the spacer line pattern is formed with a material having poor step coverage characteristics and the spacer line pattern leaves an opening to the sacrificial layer below.

In exemplary embodiments in accordance with principles of inventive concepts the forming of a covered-cap, includes etching back the sacrificial layer through the opening.

In exemplary embodiments in accordance with principles of inventive concepts the sacrificial layer pattern is formed of a material having an etch selectivity with respect to the lower insulating pattern and the spacer line pattern.

In exemplary embodiments in accordance with principles of inventive concepts further includes forming a filling insulation over the spacer line pattern to fill the opening; and etching back the filling insulation and spacer line pattern to form an upper insulating layer.

BRIEF DESCRIPTION OF THE DRAWINGS

The inventive concept will become more apparent in view of the attached drawings and accompanying detailed description.

DETAILED DESCRIPTION OF THE EMBODIMENTS

Figure 1:
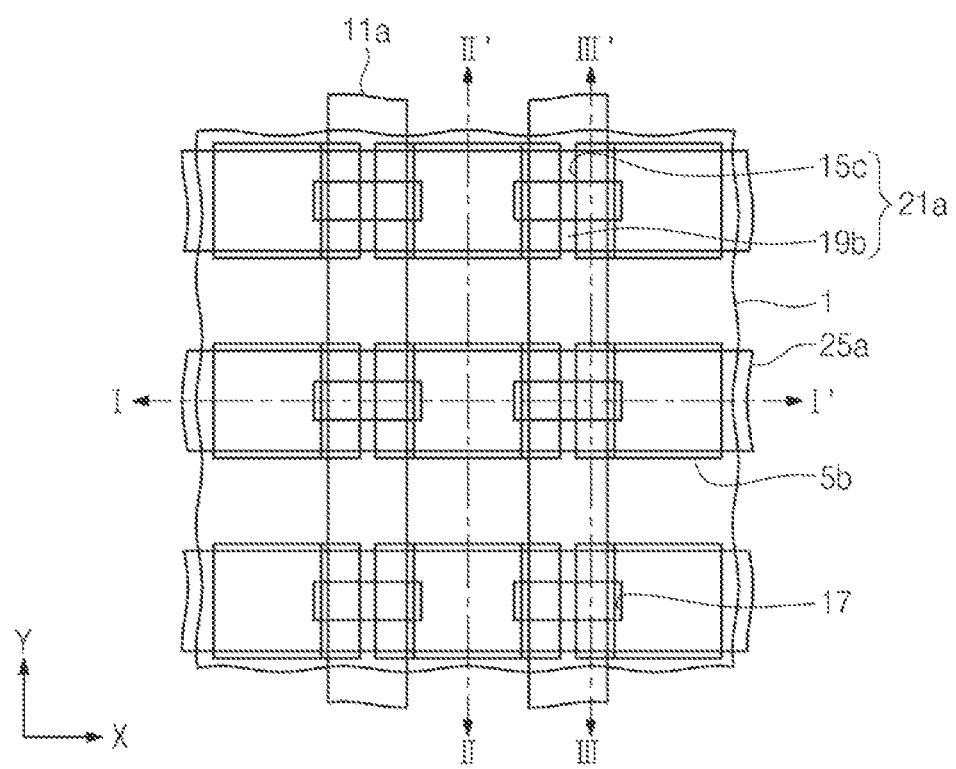
FIG. 1 is a plan view illustrating a semiconductor device according exemplary embodiments in accordance with principles of inventive concepts.

Exemplary embodiments in accordance with principles of inventive concepts will now be described more fully with reference to the accompanying drawings, in which exemplary embodiments are shown. Exemplary embodiments in accordance with principles of inventive concepts may, however, be embodied in many different forms and should not be construed as being limited to the embodiments set forth herein; rather, these embodiments are provided so that this disclosure will be thorough and complete, and will fully convey the concept of exemplary embodiments to those of ordinary skill in the art. In the drawings, the thicknesses of layers and regions may be exaggerated for clarity. Like reference numerals in the drawings denote like elements, and thus their description may not be repeated.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be tensed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Exemplary embodiments in accordance with principles of inventive concepts are described herein with reference to cross-sectional illustrations that are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments in accordance with principles of inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments in accordance with principles of inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, an exemplary embodiment may be described with sectional views as ideal exemplary views of the inventive concept. Accordingly, shapes of the exemplary views may be modified according to manufacturing techniques and/or allowable errors. Therefore, exemplary embodiments of inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments in accordance with principles of inventive concepts explained and illustrated herein include their complementary counterparts. The same reference numerals or the same reference designators denote the same elements throughout the specification.

Moreover, exemplary embodiments in accordance with principles of inventive concepts may be described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Hereinafter, embodiments of the inventive concept will be described in more detail with reference to drawings.

Figure 2:
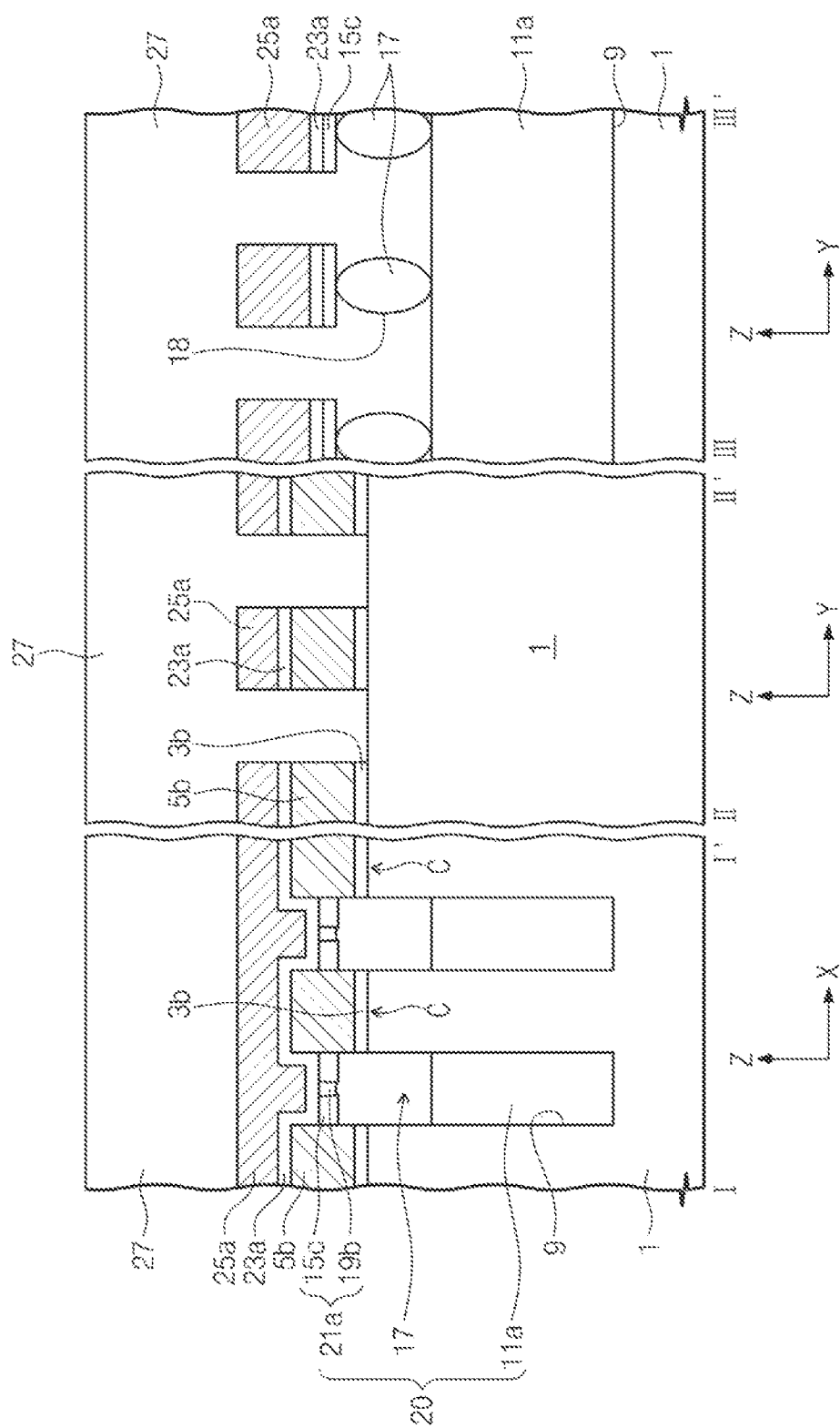
FIG. 2 is a cross-sectional view taken along lines I-I', II-II', and III-III' of FIG. 1.

FIG. 1 is a plan view illustrating a semiconductor device according exemplary embodiments in accordance with principles of inventive concepts, and FIG. 2 is a cross-sectional view taken along lines I-I', II-II', and III-III' and of FIG. 1.

In an exemplary embodiment in accordance with principles of inventive concepts of FIGS. 1 and 2, floating gate patterns 5b disposed on a substrate 1 are to be isolated from each other. Floating gate patterns 5b may have island shapes, that is, may be isolated from one another, for example. Tunnel insulating pattern 3b is interposed between floating gate pattern 5b and substrate 1. Control gate lines 25a are disposed over floating gate patterns 5b to extend in a first direction X. Blocking insulating pattern 23a is interposed between control gate line 25a and floating gate pattern 5b.

In an exemplary embodiment in accordance with principles of inventive concepts, device isolation structure 20 is disposed between neighboring floating gate patterns 5b under control gate line 25a. Device isolation structure 20 includes lower insulating pattern 11a, upper insulating pattern 21a, and gap region 17 (also referred to herein as "gap volume") disposed between lower insulating pattern 11a and upper insulating pattern 21a. In an exemplary embodiment in accordance with principles of inventive concepts, lower insulating pattern 11a may be formed using Tonen Silazene (TOSZ) and may include silicon oxide, for example. Upper insulating pattern 21a may include filling insulating recess pattern 19b and spacer recess patterns 15c covering both sidewalls of filling insulating recess pattern 19b. Lower insulating pattern 11a may have a line shape extending in a second direction Y crossing the first direction X (for example, orthogonal to first direction X). Device isolation structure 20 is disposed in a trench 9 extending in second direction Y. Lower insulating pattern 11a covers the bottom of trench 9. A bottom surface of upper insulating pattern 21a is higher than a bottom surface of floating gate pattern 5b and is lower than a bottom surface of blocking insulating pattern 23a in an exemplary embodiment in accordance with principles of inventive concepts. Additionally, a top surface of lower insulating pattern 11a is lower than a bottom surface of tunnel insulating pattern 3b.

More particularly, in an exemplary embodiment in accordance with principles of inventive concepts, a bottom surface of filling insulating recess pattern 19b is higher than the bottom surface of floating gate pattern 5b and is lower than the bottom surface of blocking insulating pattern 23a. As a result, gap region 17 is disposed between floating gate patterns 5b adjacent to each other. Additionally, gap region 17 is also disposed at a surface of substrate 1 under tunnel insulating pattern 3b. That is, gap region 17 is also disposed between channel regions C adjacent to each other. In accordance with principles of inventive concepts, a solid does not exist in gap region 17. Because gas, such as air, may fill gap region 17 or gap region 17 may be at a vacuum (that is, at a relatively low pressure), the dielectric constant of gap region 17 is approximately 1. The dielectric constant of gap region 17 is therefore significantly lower than the dielectric constant (3.9~4.2) of silicon oxide. Because the dielectric constant of gap region 17 is very small, a parasitic capacitance between floating gate patterns 5b may be significantly lower than it would otherwise be and, coupling between floating gates 5b may thereby be significantly reduced. Reducing the capacitive coupling in this manner, reduces interference between cells adjacent to each other.

In accordance with principles of inventive concepts, interlayer insulating layer 27 is disposed on substrate 1, including control gate line 25a. Interlayer insulating layer 27 may provide a sidewall 18 to gap region 17 under upper insulating pattern 21a. That is, sidewall 18 of the gap region 17 may be formed of interlayer insulating layer 27.

An exemplary method in accordance with principles of inventive concepts of forming a semiconductor device having the structure of FIGS. 1 and 2 will be described in the discussion related to FIGS. 3, 5, 12, and 19, which are plan views illustrating a method of forming the semiconductor device of FIG. 1. Additionally, FIGS. 4, 6 to 11, 13 to 18, and 20 are cross-sectional view illustrating a method of forming a semiconductor device having a cross section of FIG. 2 in accordance with principles of inventive concepts. FIG. 21 is a perspective view illustrating a portion of a semiconductor device of FIGS. 19 and 20.

Figure 3:
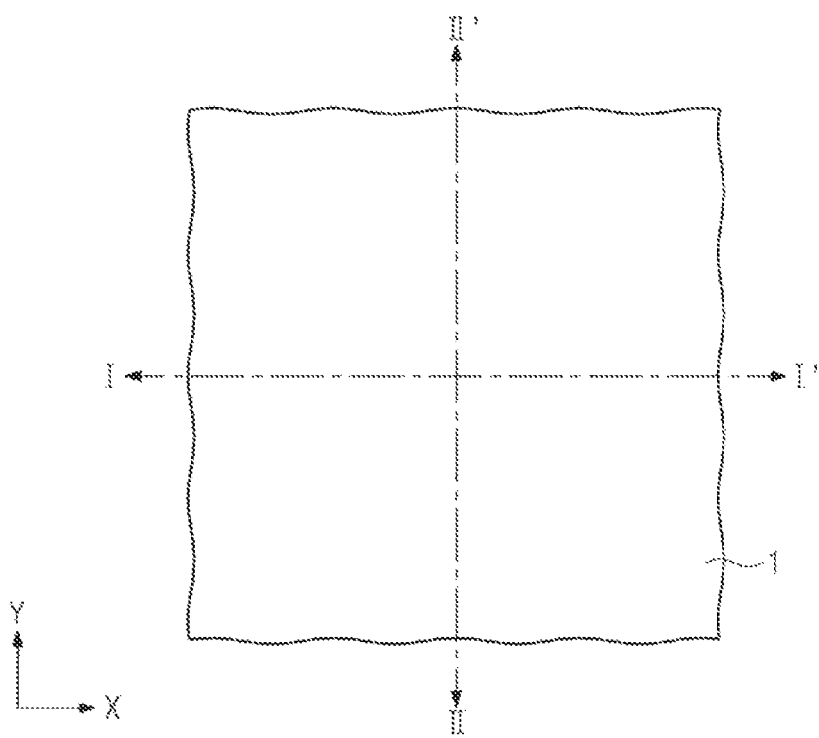
FIGS. 3, 5, 12, and 19 are plan views illustrating a method of forming the semiconductor device of FIG. 1 in accordance with principles of inventive concepts.
Figure 4:
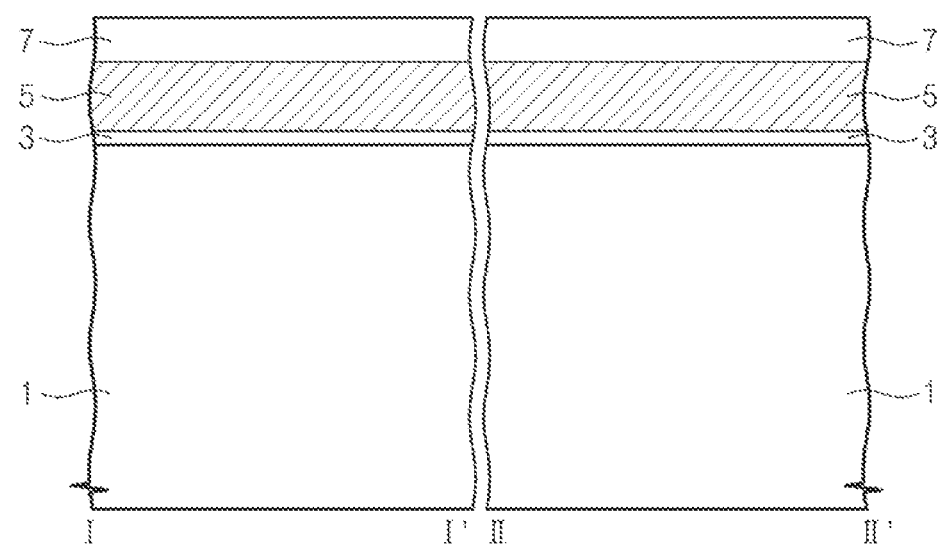
FIGS. 4, 6 to 11, 13 to 18, and 20 are cross-sectional view illustrating a method of forming the semiconductor device having a cross section of FIG. 2 in accordance with principles of inventive concepts.

Referring to FIGS. 3 and 4, tunnel insulating layer 3 is formed on a semiconductor substrate 1 (hereinafter, referred to as 'a substrate'). Tunnel insulating layer 3 may be formed of a thermal oxide layer, for example. Floating gate layer 5 is formed on the tunnel insulating layer 3. Floating gate layer 5 may be formed of a poly-silicon layer doped with dopants, for example. A hard mask layer 7 is formed on floating gate layer 5.

Figure 5:
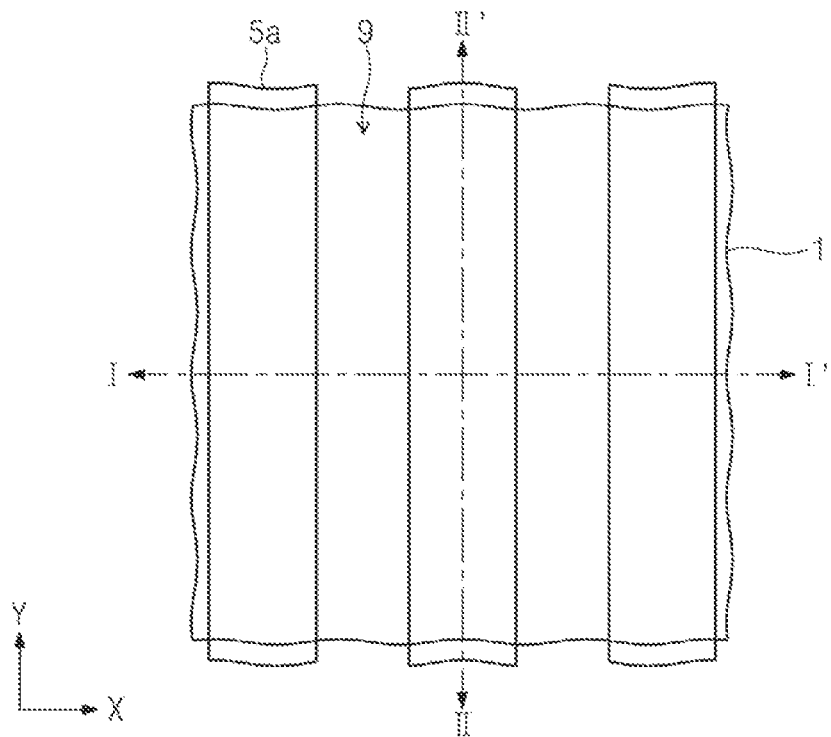
Figure 6:
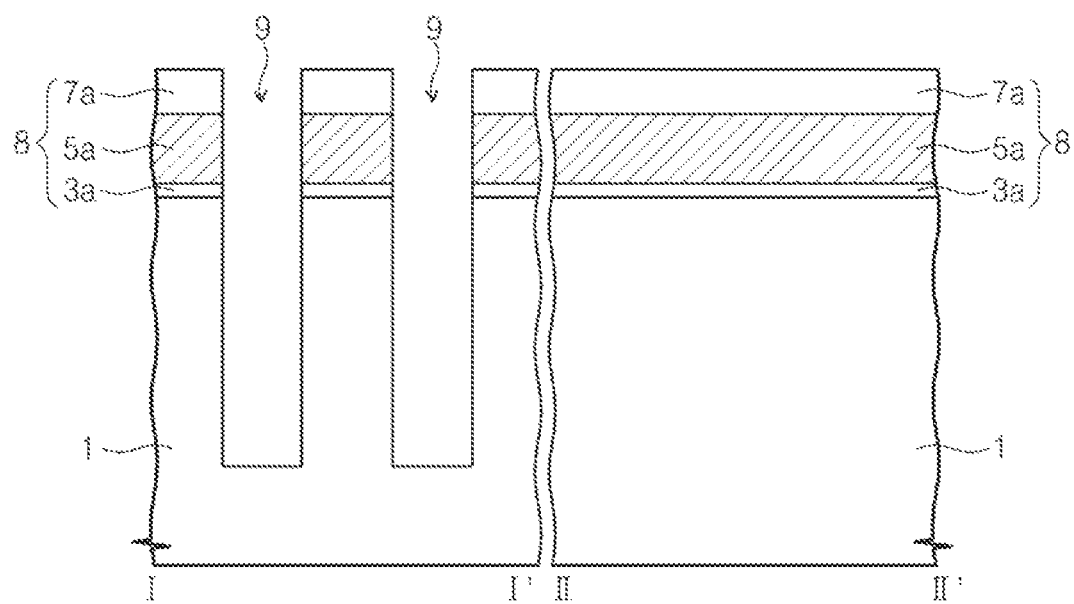

Referring to FIGS. 5 and 6, hard mask layer 7, floating gate layer 5, tunnel insulating layer 3, and a portion of substrate 1 are sequentially patterned to form a trench 9 extending in second direction Y. Additionally, hard mask layer 7, floating gate layer 5, tunnel insulating layer 3, and a portion of substrate 1 are sequentially patterned to form tunnel insulating line pattern 3a, a floating gate line pattern 5a, and a hard mask pattern 7a sequentially stacked. In an exemplary embodiment in accordance with principles of inventive concepts, tunnel insulating line pattern 3a, floating gate line pattern 5a, and hard mask pattern 7a may substantially embody a mask structure 8.

Figure 7:
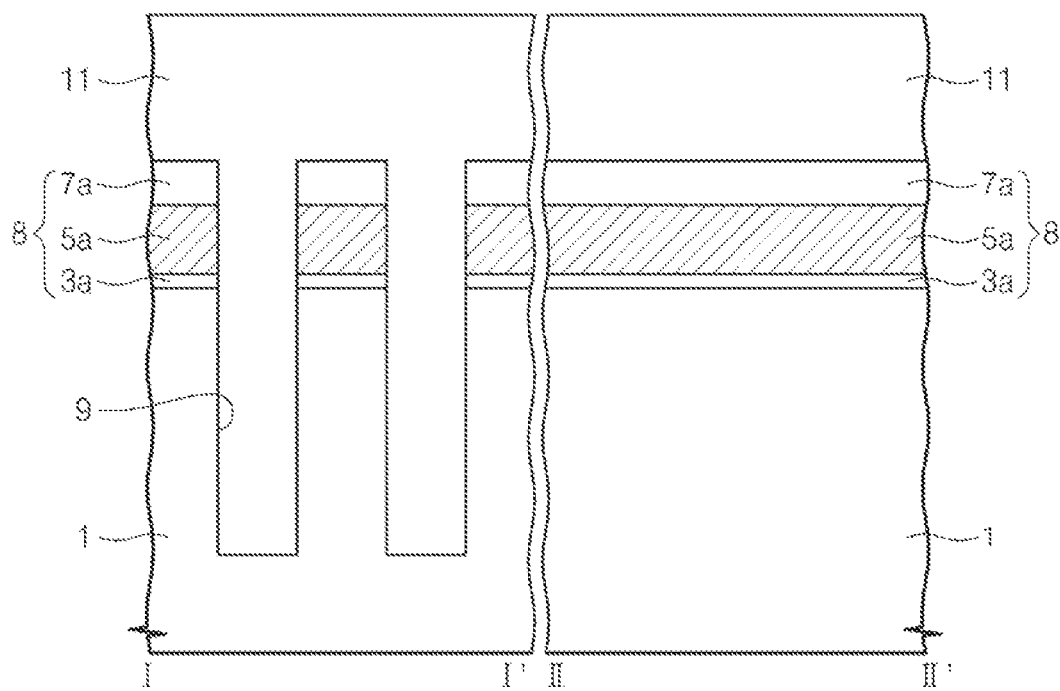

Referring to FIG. 7, in an exemplary embodiment in accordance with principles of inventive concepts, lower insulating layer 11 is formed on an entire surface of substrate 1 to fill trench 9. Lower insulating layer 11 may be formed of a spin on glass series insulating layer with excellent filling characteristic (or excellent step coverage characteristic). A method of forming the lower insulating layer 11 in accordance with principles of inventive concepts will be described with reference to chemical formula 1. Lower insulating layer 11 may be formed using Tonen Silazene (TOSZ). A TOSZ layer may be polysilazane, for example. When lower insulating layer 11 is formed using TOSZ, a TOSZ layer may formed by a spin-coating method, for example. Subsequently, $O_2$ and $H_2O$ are provided to perform an annealing process on the TOSZ layer. As a result, ammonia and hydrogen are removed from the TOSZ layer, and the TOSZ layer may be changed into a silicon oxide ($SiO_2$) layer. That is, lower insulating layer 11 may thereby include a silicon oxide layer.

[Chemical formula 1]

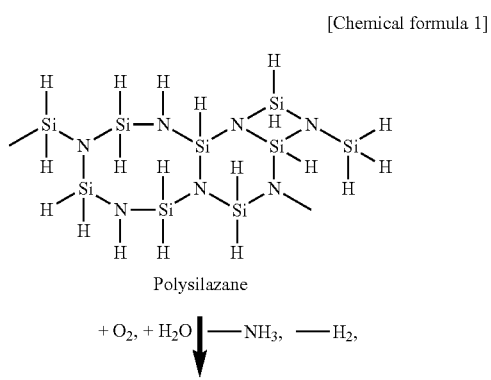

Polysilazane $+ O_2, + H_2O \downarrow -NH_3, -H_2$

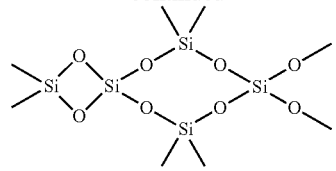

Figure 8:
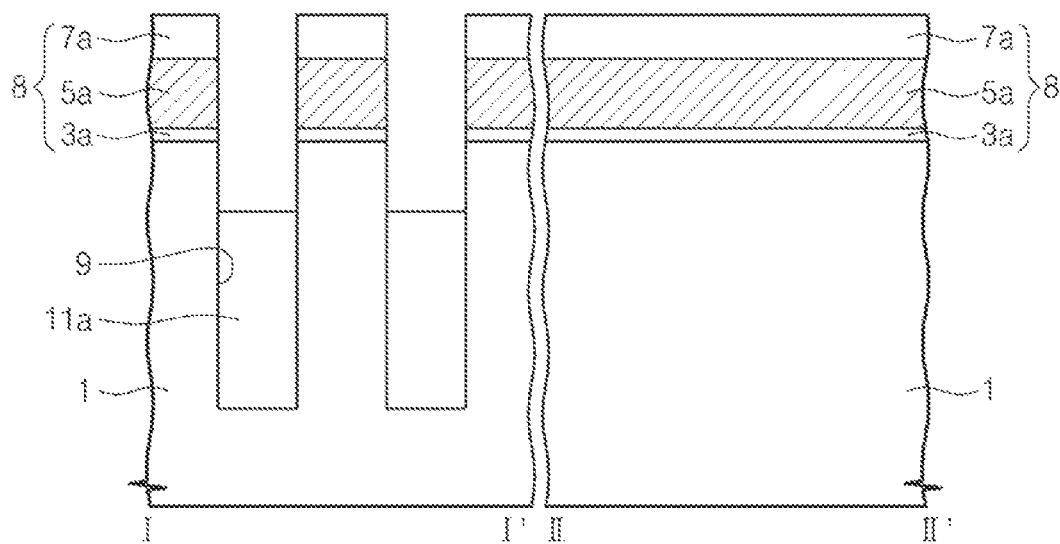

In an exemplary embodiment in accordance with principles of inventive concepts of FIG. 8, an etching process is performed on lower insulating layer 11 to expose a top surface and a sidewall of hard mask pattern 7a, sidewalls of floating gate line pattern 5a, and a sidewall of tunnel insulating line pattern 3a, and to form a lower insulating pattern 11a covering the bottom of trench 9. Lower insulating pattern 11a may have a line shape extending in second direction Y, for example. A top surface of lower insulating pattern 11a may be formed to be lower than a bottom surface of tunnel insulating line pattern 3a. The height of the top surface of lower insulating pattern 11a may be controlled to control a position of a bottom end of a gap region formed later, for example.

Figure 9:
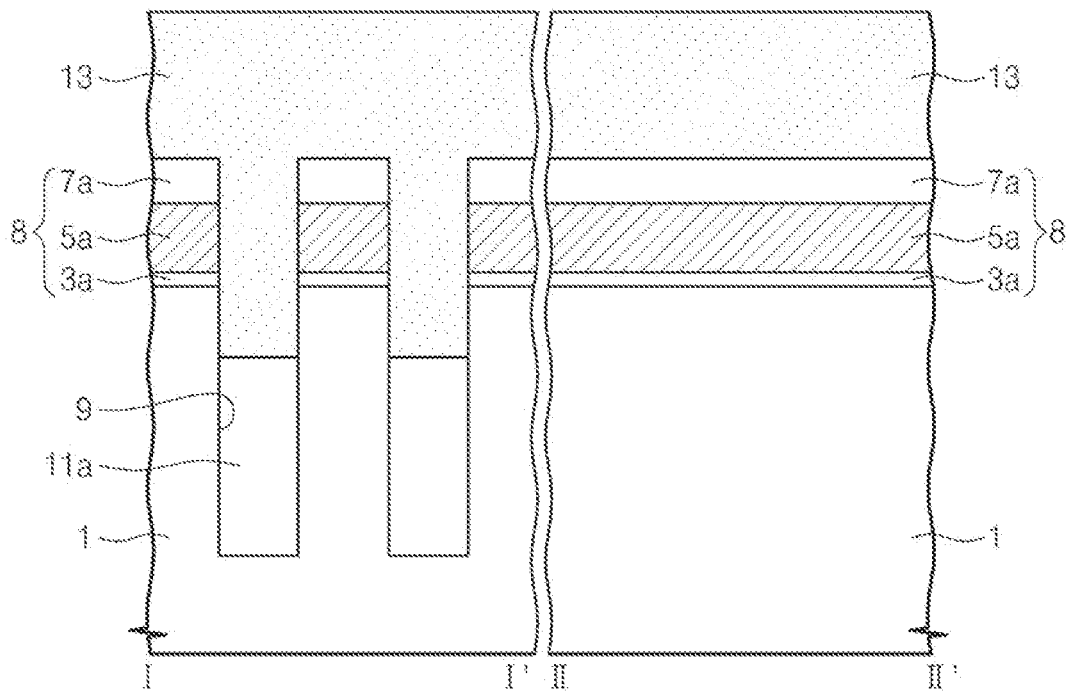

In an exemplary embodiment in accordance with principles of inventive concepts as illustrated in FIG. 9, sacrificial layer 13 may be formed on the entire upper surface of substrate 1 to fill trench 9. Sacrificial layer 13 may be formed of a material having an etch selectivity with respect to lower insulating pattern 11a and a spacer line pattern (15a of FIGS. 12 and 13) formed later. Sacrificial layer 13 may be formed of a spin-on hard mask (SOH) layer or an amorphous silicon layer, for example. In accordance with principles of inventive concepts SOH layer may be an insulating layer of hydrocarbon series.

Figure 10:
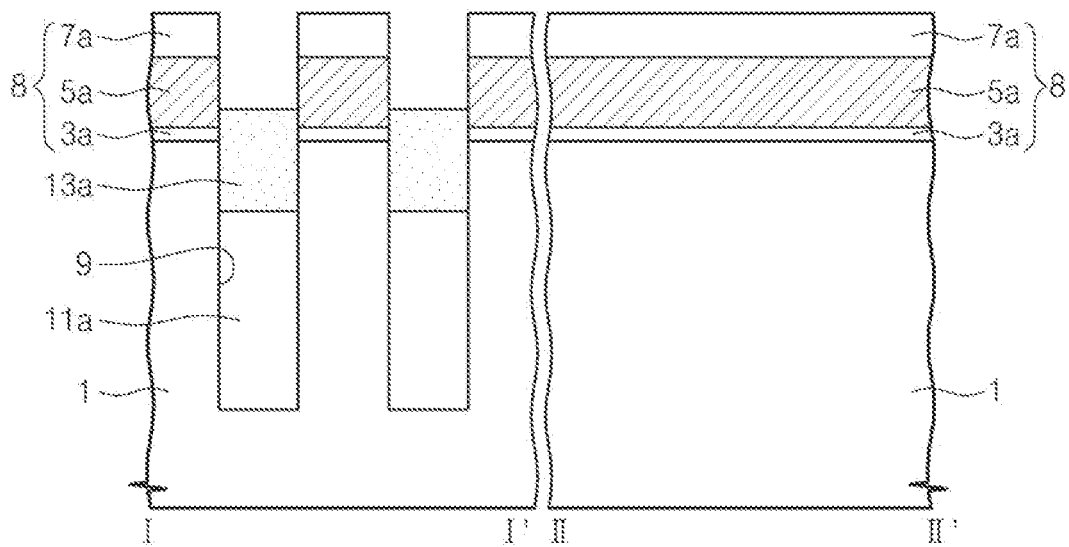

In an exemplary embodiment in accordance with principles of inventive concepts depicted in FIG. 10, an etching process may be performed on sacrificial layer 13 to expose the top surface and sidewall of hard mask pattern 7a and a portion of a sidewall of floating gate line pattern 5a, and to form sacrificial pattern 13a in trench 9. Sacrificial pattern 13a may have a line shape extending in second direction Y. A top surface of sacrificial pattern 13a may be formed to be higher than a bottom surface of floating gate line pattern 5a and lower than a top surface of floating gate line pattern 5a. A height of the top surface of sacrificial pattern 13a may be controlled to control a position of a top end of gate region formed later. The etching process performed on sacrificial layer 13 may be an isotropic etching process or an etch-back process, for example. In an exemplary embodiment in accordance with principles of inventive concepts whereby sacrificial layer 13 is formed of an amorphous silicon layer, a portion of sacrificial layer 13 may be isotropically/anisotropically etched using chlorine gas to be removed. In an exemplary embodiment in accordance with principles of inventive concepts whereby sacrificial layer 13 is formed of an SOH layer, a portion of sacrificial layer 13 may be isotropically/anisotropically etched using oxygen gas to be removed.

Figure 11:
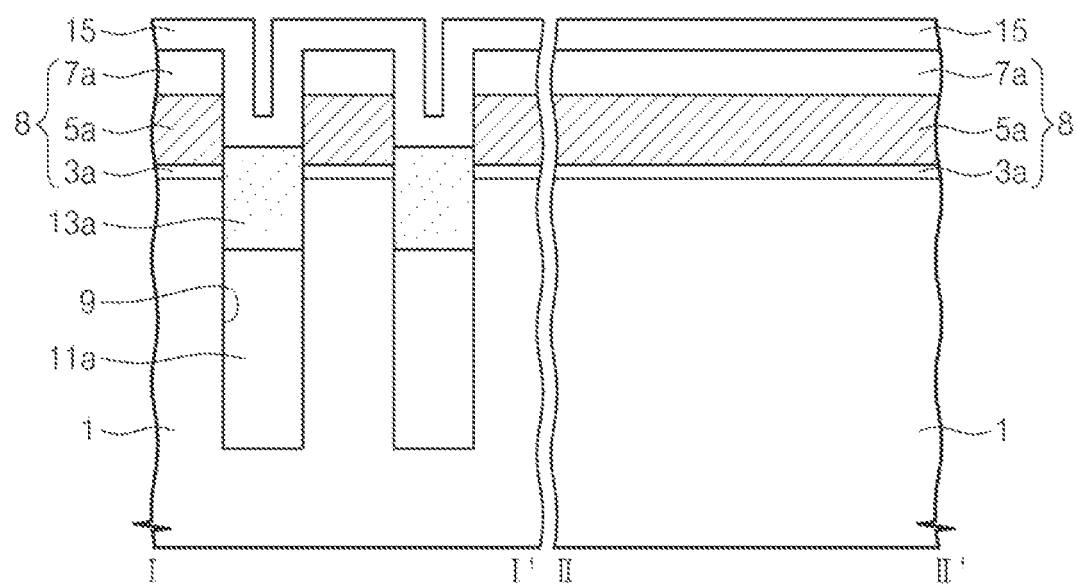

In an exemplary embodiment in accordance with principles of inventive concepts depicted in FIG. 11, spacer layer 15 is conformally formed on an entire surface of substrate 1. Spacer layer 15 may include at least one of: a silicon oxide layer, a silicon oxynitride layer, or a silicon nitride layer. Spacer layer 15 may have a thickness capable of partially filling an upper portion of trench 9.

Figure 12:
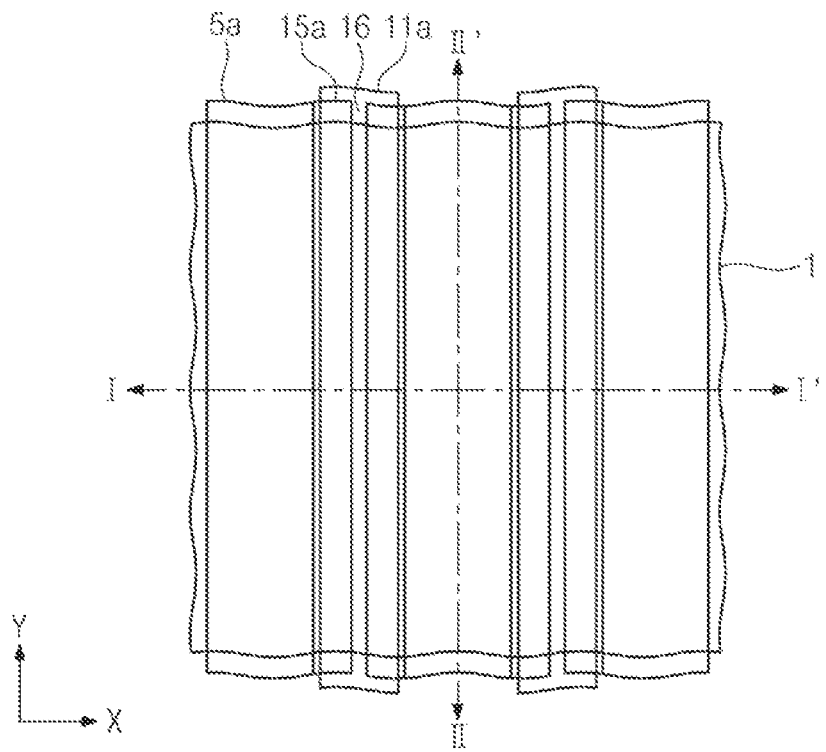
Figure 13:
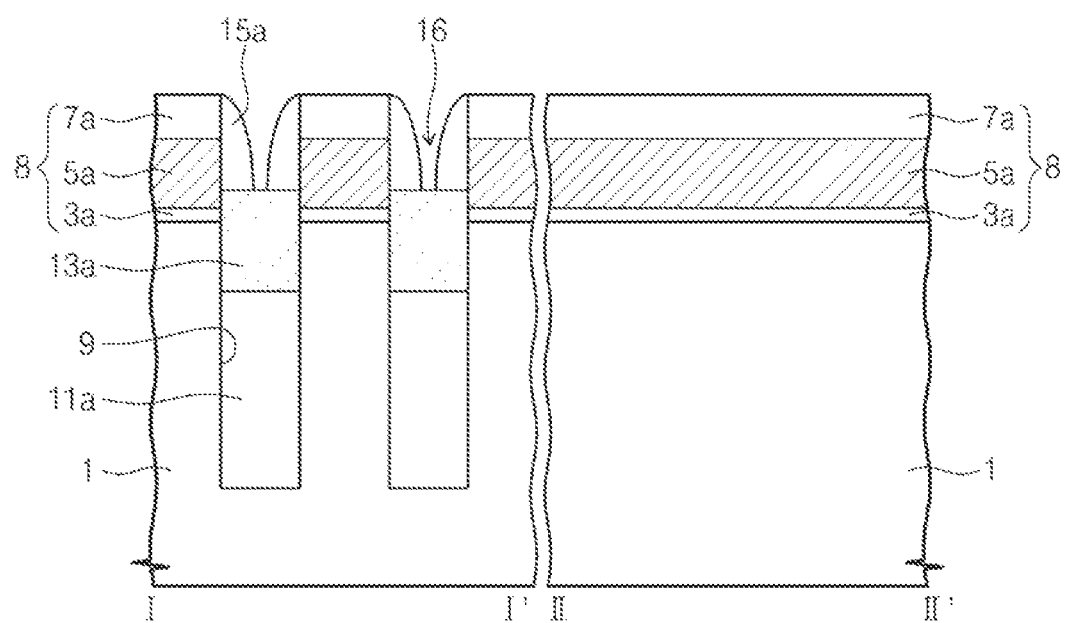

In an exemplary embodiment in accordance with principles of inventive concepts depicted in FIGS. 12 and 13, an etch-back process is performed on spacer layer 15 to form a spacer line pattern 15a covering a sidewall of hard mask pattern 7a and a sidewall of floating gate line pattern 5a. A width of spacer line pattern 15a is smaller than half the width of sacrificial pattern 13a, and, as a result, the top surface of sacrificial pattern 13a between neighboring spacer line patterns 15a is exposed. That is, opening 16 is formed between the neighboring spacer line patterns 15a to expose the top surface of sacrificial pattern 13a.

Figure 14:
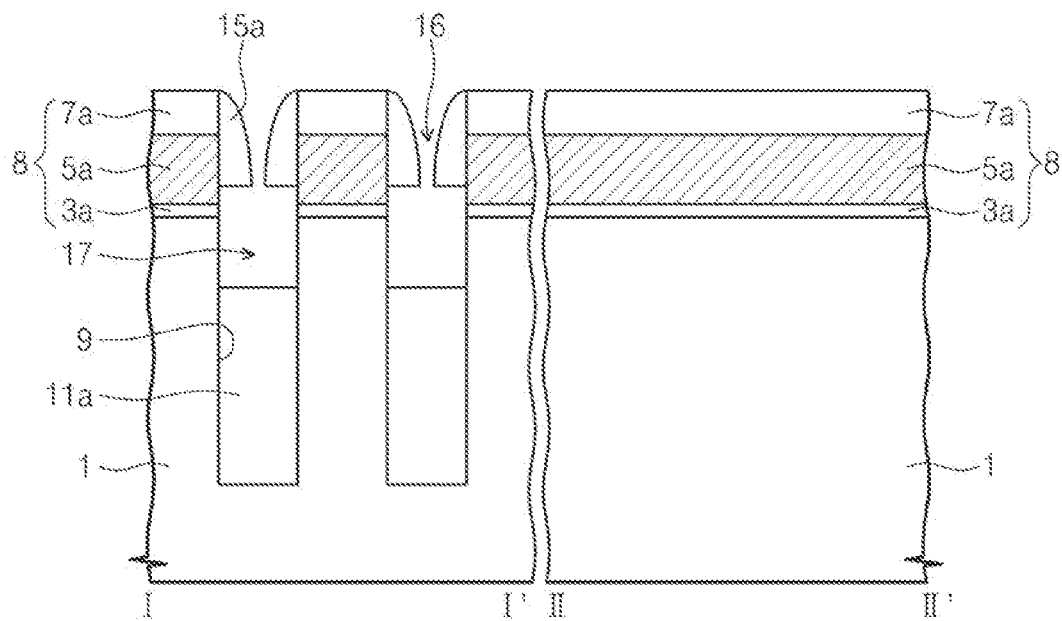

In an exemplary embodiment in accordance with principles of inventive concepts depicted in FIG. 14, sacrificial pattern 13a is selectively etched through opening 16. In an exemplary embodiment in accordance with principles of inventive concepts in which sacrificial pattern 13a is formed of an amorphous silicon layer, a portion of sacrificial pattern 13a may be isotropically etched for removal using chlorine gas. In an exemplary embodiment in accordance with principles of inventive concepts in which sacrificial pattern 13a is formed of an SOH layer, a portion of sacrificial pattern 13a may be isotropically etched for removal using oxygen gas. An isotropic etching process using oxygen gas may be referred to as an ashing process. Because sacrificial pattern 13a is removed to form gap region 17, gap region 17 is a region where sacrificial pattern 13a is removed.

Figure 15:
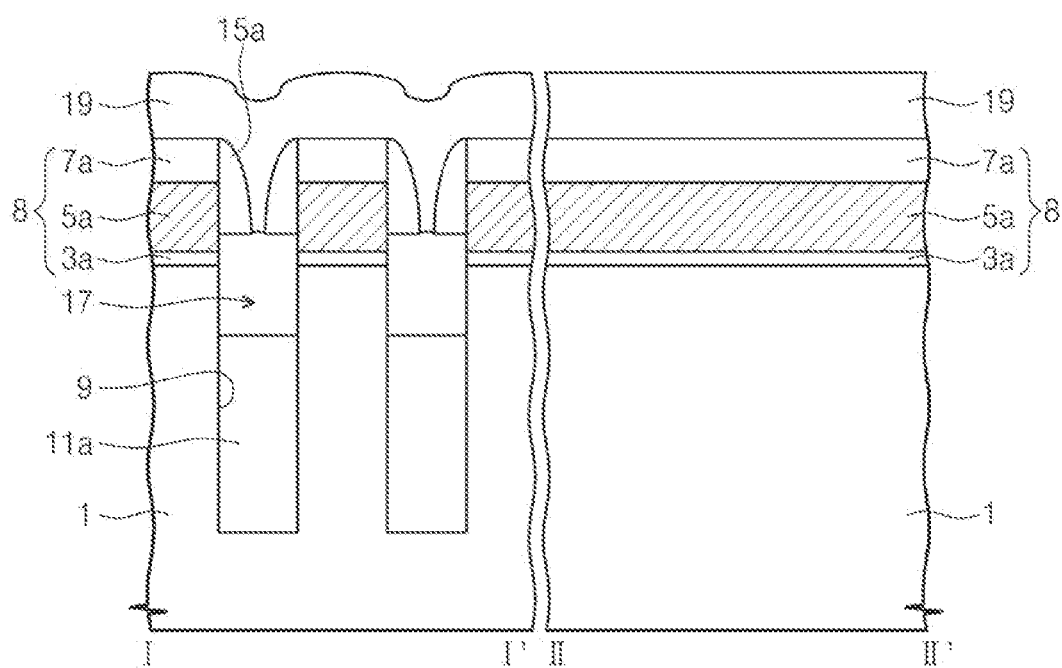

In an exemplary embodiment in accordance with principles of inventive concepts depicted in FIG. 15, filling insulating layer 19 is formed on the entire surface of substrate 1. Filling insulating layer 19 may be formed of an insulating layer with poor step coverage characteristic and/or using a process having poor step coverage characteristic. As a result, filling insulating layer 19 does not pass through narrow opening 16 and filling insulating layer 19 is minimally formed in gap region 17. Filling insulating layer 19 is formed to cover a sidewall of spacer line pattern 15a. Filling insulating layer 19 may fill opening 16.

Figure 16:
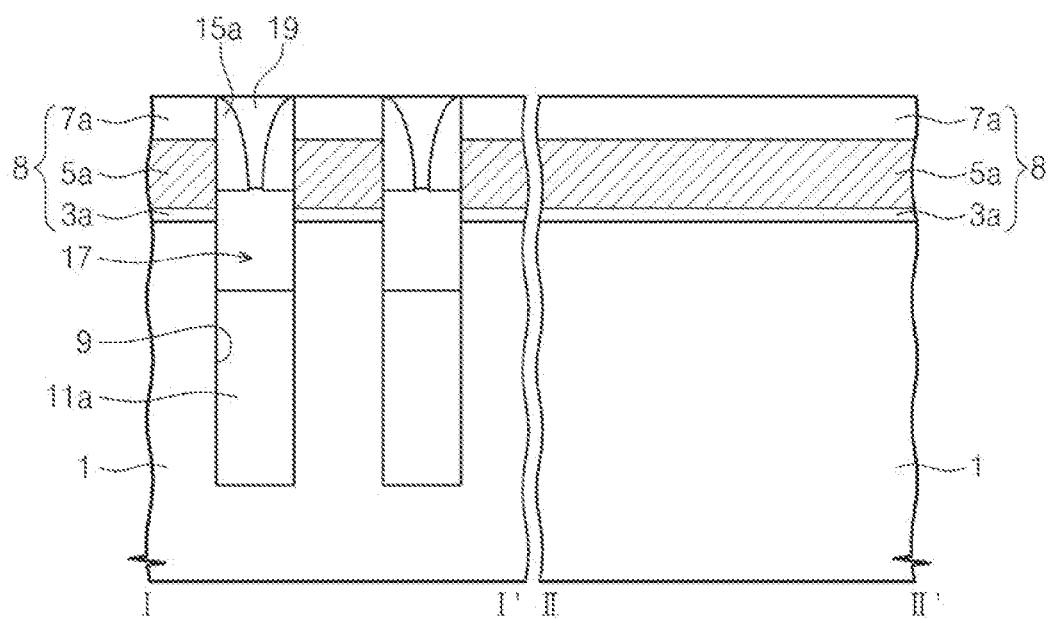

In an exemplary embodiment in accordance with principles of inventive concepts depicted in FIG. 16, a planarization etching process is performed on filling insulating layer 19 to expose the top surface of hard mask pattern 7a.

Figure 17:
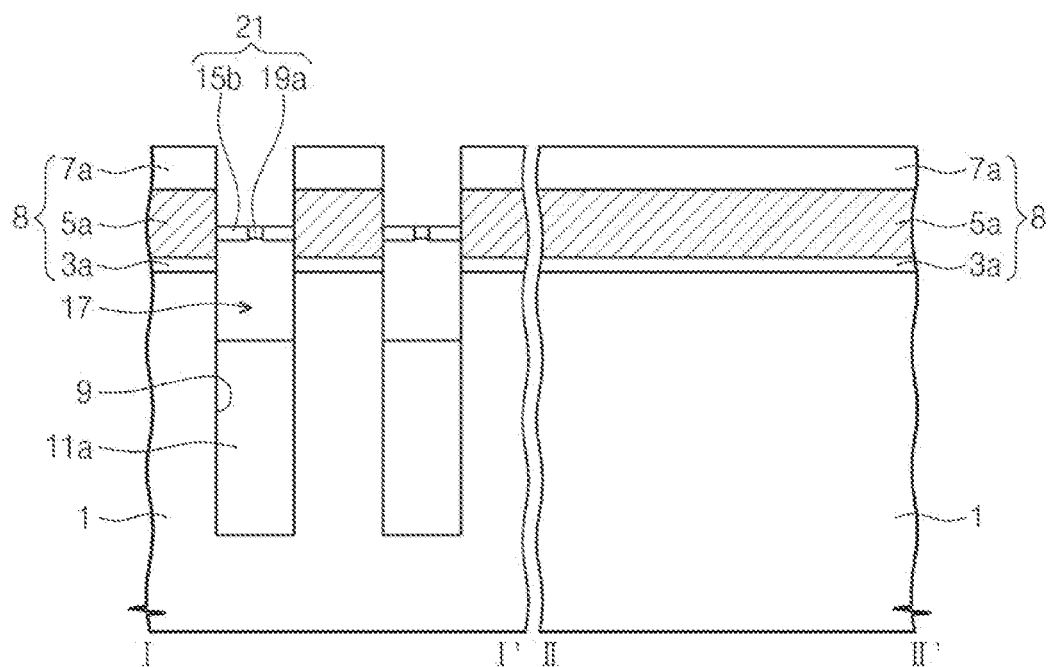

In an exemplary embodiment in accordance with principles of inventive concepts depicted in FIG. 17, an etching process is performed to recess upper portions of filling insulating layer 19 and spacer line pattern 15a, and to expose the sidewall of hard mask pattern 7a and a portion of the sidewall of floating gate line pattern 5a. As a result, filling insulating recess line pattern 19a and spacer recess line pattern 15b are formed. Filling insulating recess line pattern 19a and spacer recess line pattern 15b may have top surfaces coplanar with each other, for example. Filling insulating recess line pattern 19a and spacer recess line pattern 15b may substantially constitute upper insulating layer 21. Upper insulating layer 21 ensures that gap region 17 is maintained, that is, "kept open," during subsequent processing. If, for example, upper insulating layer 21 were not in place, a subsequently-deposited blocking layer may form on top of lower insulating pattern 11a, thereby filling gap region 17 and subverting the purpose (that is, lower dielectric constant), of gap region 17.

Figure 18:
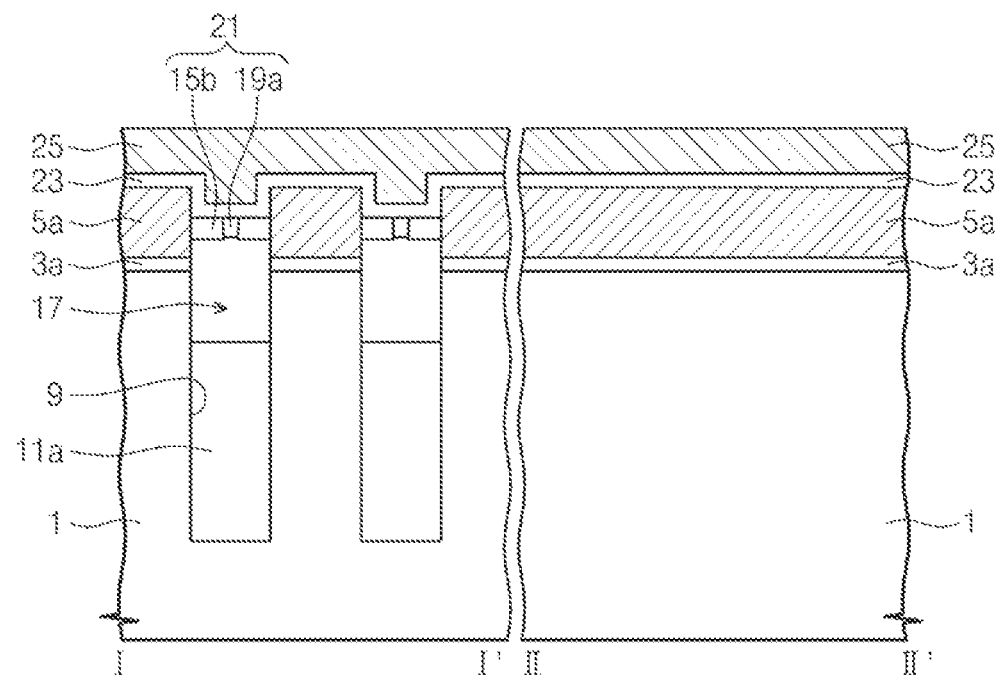

In an exemplary embodiment in accordance with principles of inventive concepts depicted in FIG. 18, hard mask pattern 7a is removed by a selective etching process to expose the top surface of floating gate line pattern 5a. Subsequently, blocking insulating layer 23 and a control gate layer 25 may be sequentially and conformally stacked. For example, blocking insulating layer 23 may be formed of a triple layer of oxide-nitride-oxide. Alternatively, the blocking insulating layer 23 may be formed of a high-k dielectric layer, for example.

Figure 19:
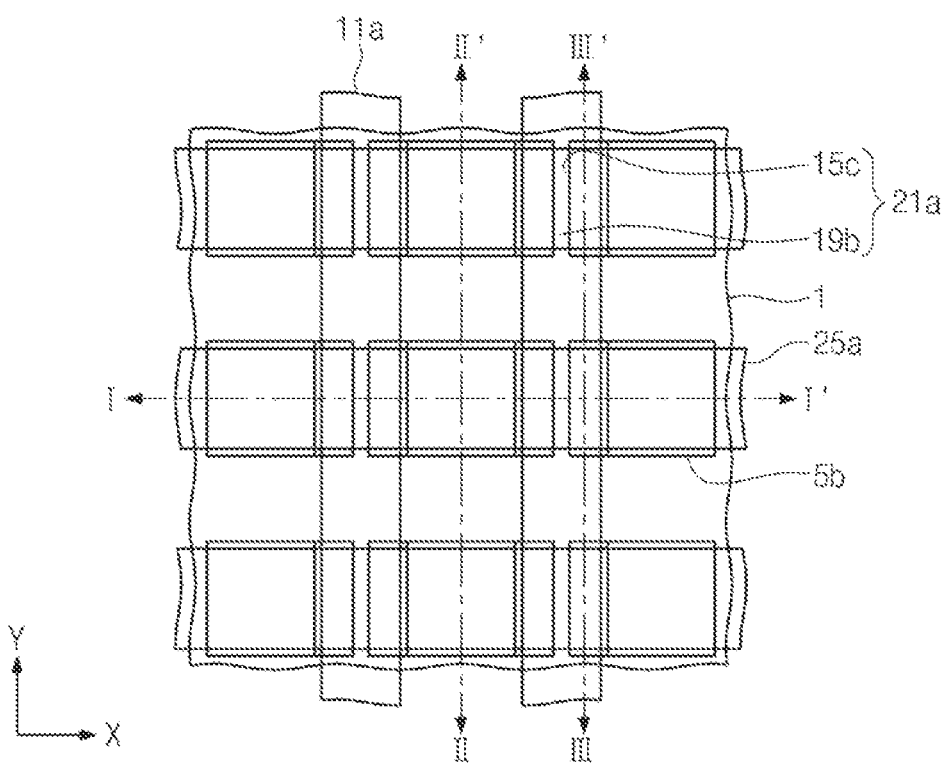
Figure 20:
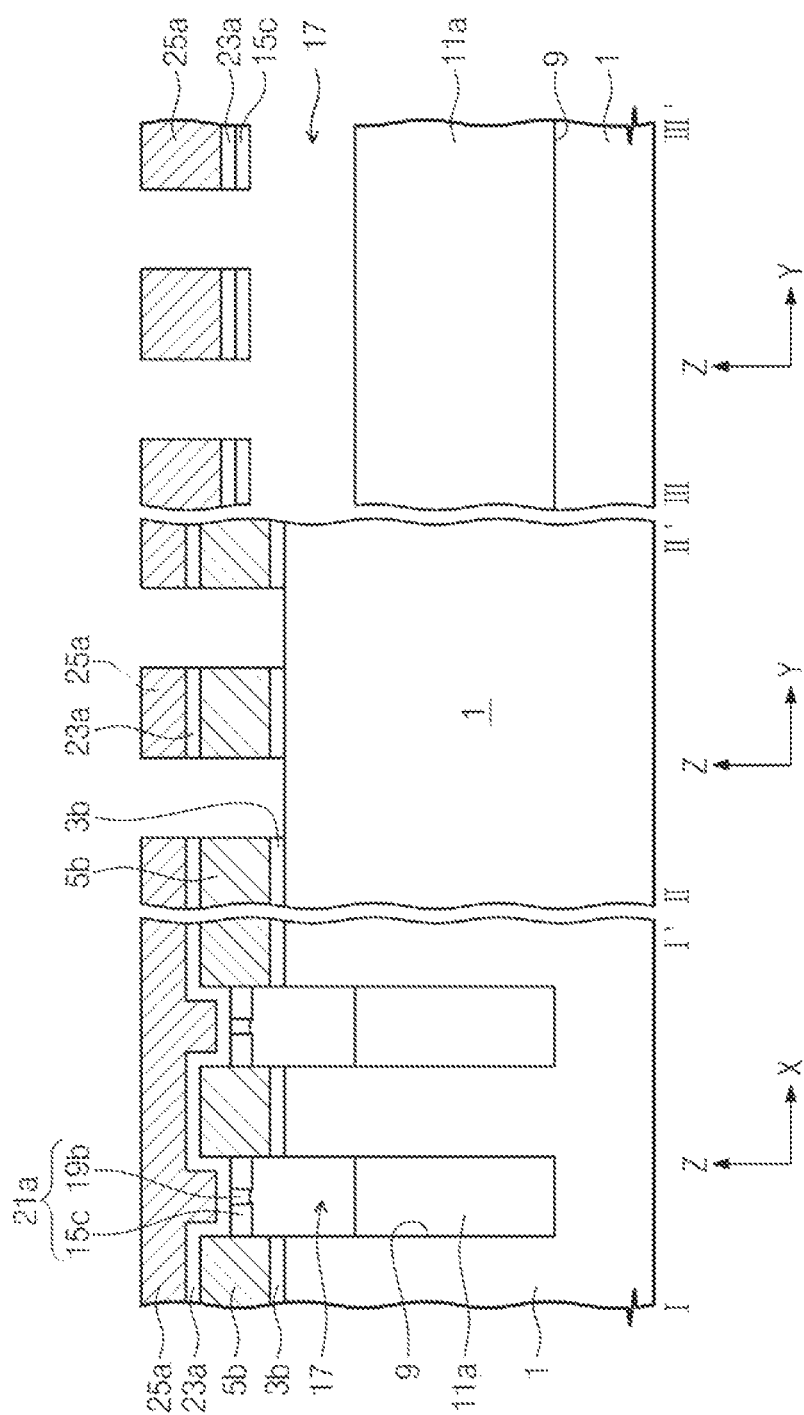
Figure 21:
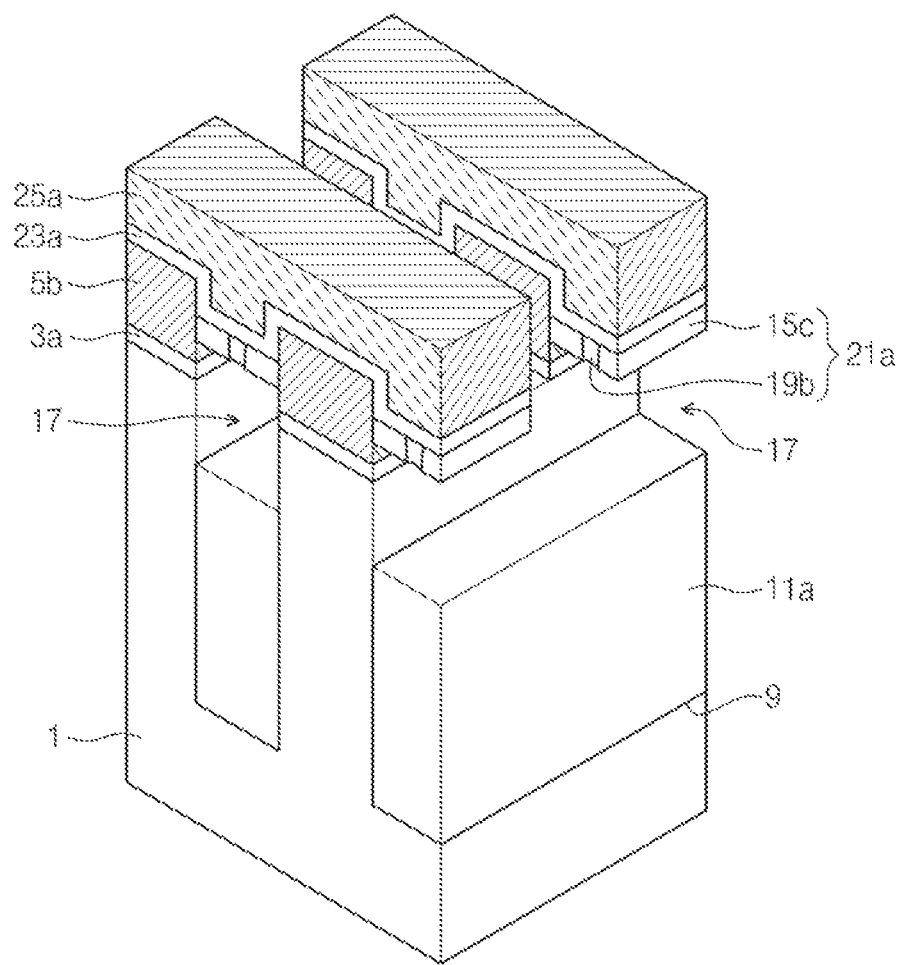
FIG. 21 is a perspective view illustrating a portion of an exemplary embodiments in accordance with principles of inventive concepts of the semiconductor device of FIGS. 19 and 20.

In an exemplary embodiment in accordance with principles of inventive concepts depicted in FIGS. 19, 20, and 21, by performing an etching process, control gate layer 25, blocking insulating layer 23, and floating gate line pattern 5a are successively etched to form floating gate patterns 5b separated from each other into what is referred to herein as island shapes, a blocking insulating pattern 23a connecting floating gate pattern 5b in the first direction X, and a control gate line 25a on blocking insulating pattern 23a. Additionally, upper insulating layer 21 between the control gate lines 25a adjacent to each other is removed to expose gap region 17 and to form upper insulating pattern 21a between floating gate patterns 5b which are adjacent to each other and overlap control gate line 25a. Upper insulating pattern 21a includes a spacer recess pattern 15c and a filling insulating recess pattern 19b. In the etching process, tunnel insulating line pattern 3a may be etched to form a tunnel insulating pattern 3b. In the etching process, lower insulating pattern 11a protects substrate 1. In an exemplary embodiment in accordance with principles of inventive concepts, lower insulating pattern 11a protects substrate 1 from damage during the etching process performed to form gate lines 25a.

In an exemplary embodiment in accordance with principles of inventive concepts depicted in FIGS. 1 and 2, interlayer insulating layer 27 is formed on substrate 1. Interlayer insulating layer 27 may be formed of an insulating layer with poor step coverage characteristic and/or using a process having poor step coverage characteristic. With poor step coverage, interlayer insulating layer 27 does not fill gap region 17 and interlayer insulating layer 27 provides sidewall 18 of gap region 17.

Figure 22:
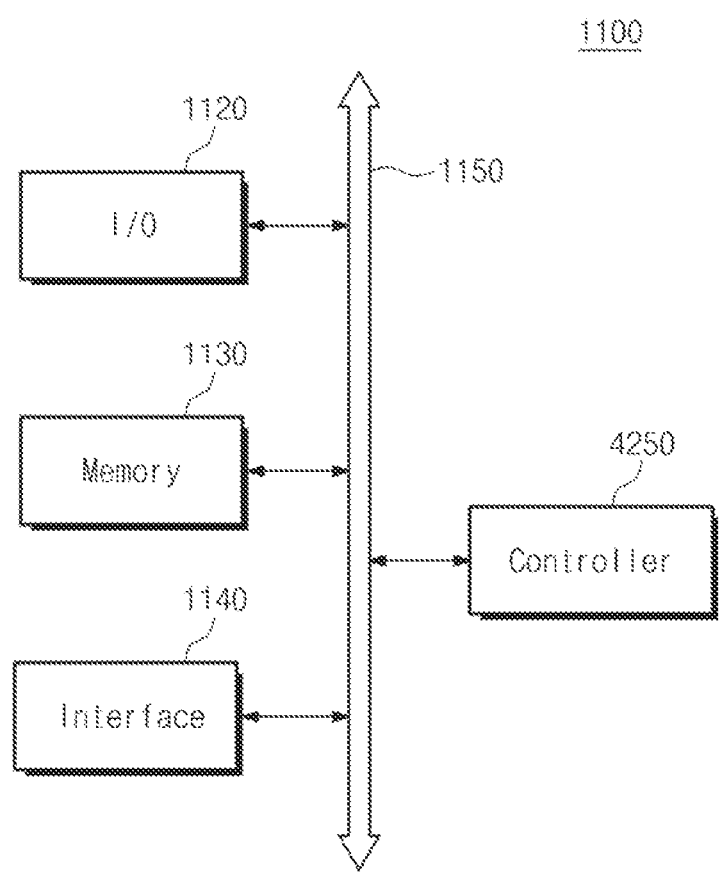
FIG. 22 is a schematic block diagram illustrating an exemplary embodiments in accordance with principles of inventive concepts of memory systems including semiconductor memory devices in accordance with principles of inventive concepts.

FIG. 22 is a schematic block diagram illustrating an example of memory systems including semiconductor memory devices in accordance with principles of inventive. Memory system 1100 may be applied to a personal digital assistant (PDA), a portable computer, a web tablet, a wireless phone, a mobile phone, a digital music player, a memory card or other electronic products. Such electronic products may receive or transmit information data by wireless transmission, for example.

Memory system 110 includes controller 4250, input/output (I/O) unit 112 such as a keypad, keyboard and display unit, memory 1130, interface unit 1140, and data bus 1150. Memory 1130 and interface unit 1140 communicate with each other through data bus 1150.

Controller 4250 may include at least one of a microprocessor, a digital signal processor, a microcontroller or another logic device. The other logic device may have a similar function to any one of the microprocessor, the digital signal processor and the microcontroller. Memory 1130 may store commands performed by controller 4250. I/O unit 112 may receive a data or a signal from the outside of system 1100 or output a data or a signal to the outside of system 1100. For example, I/O unit 112 may include a keyboard, a keypad, and/or a display device.

In an exemplary embodiment memory 1130 includes a non-volatile memory device in accordance with principles of inventive. Memory 1130 may also include another kind of a memory, a volatile memory capable of randomly accessing, and/or other various kinds of memories, for example.

Interface unit 1140 may transmit electrical data to a communication network or may receive electrical data from a communication network.

Figure 23:
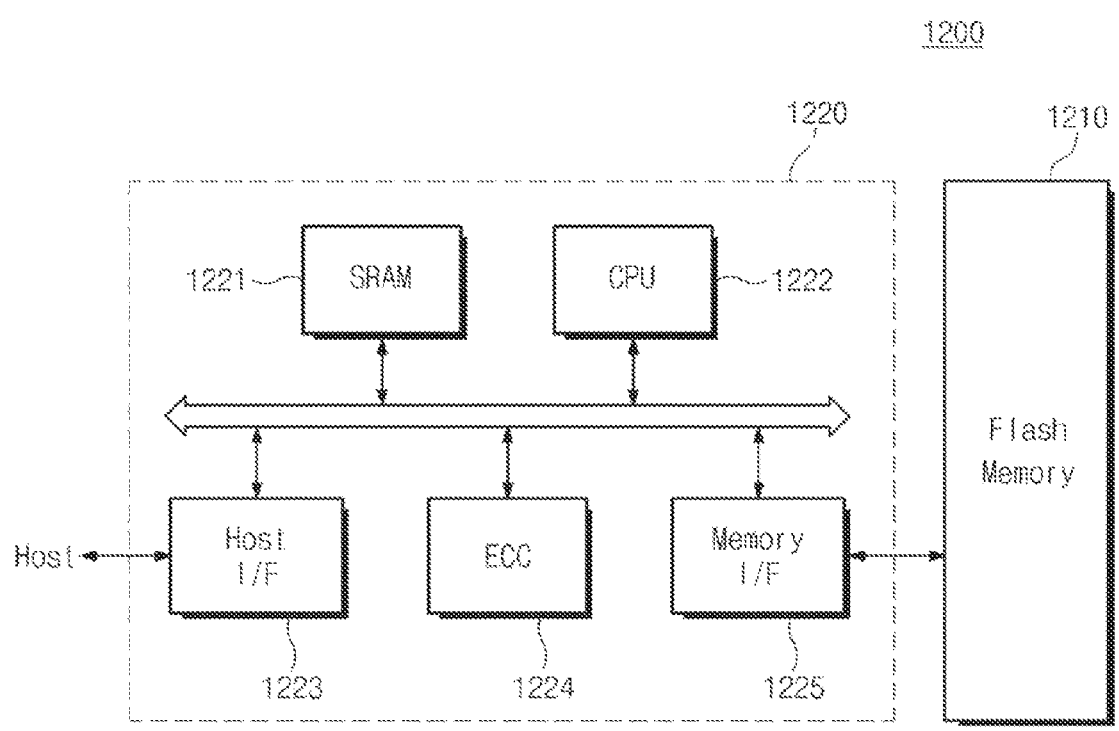
FIG. 23 is a schematic block diagram illustrating an example of memory cards including semiconductor memory devices in accordance with principles of inventive concepts.

In an exemplary embodiment in accordance with principles of inventive concepts depicted in the schematic block diagram of FIG. 23 memory cards include semiconductor memory devices in accordance with principles of inventive. Memory card 1200 for storing mass data includes flash memory device 1210 in accordance with principles of inventive concepts. Memory card 1200 includes memory controller 1220 that controls data communication between a host and memory device 1210.

SRAM 1221 is used as an operation memory of a central processing (CPU) unit 1222. Host interface unit 1223 may be configured to include a data communication protocol of the host connected to memory card 1200. Error check and correction (ECC) block 1224 checks and corrects errors of data which are read out from memory device 1210. Memory interface unit 1225 is interfaced with flash memory device 1210 in accordance with principles of inventive concepts. CPU unit 1222 controls overall operations for data communication of memory controller 1220. Though not shown in the drawings, memory card 1200 may also include a read only memory (ROM) device that stores code data to interface with the host.

Memory card 1200 may be realized as solid state disks (SSD) which are used as hard disks of computer systems, for example.

Figure 24:
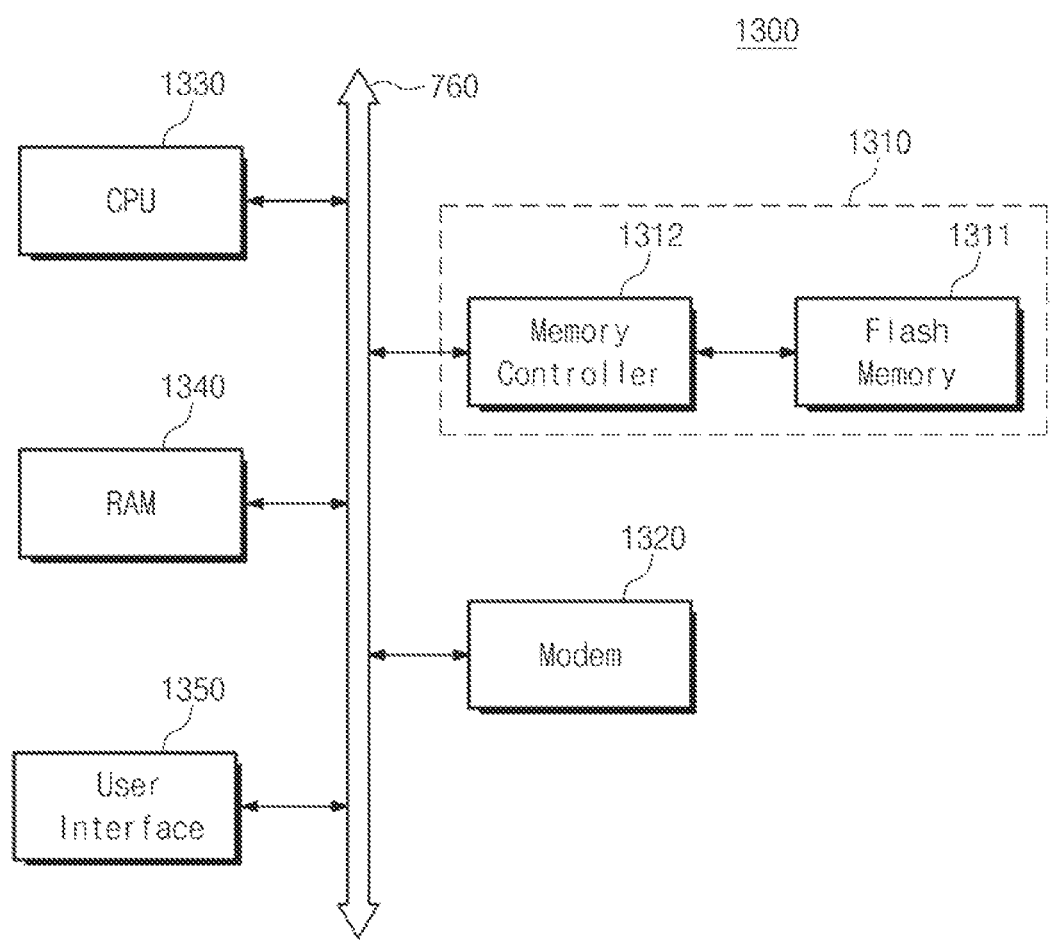
FIG. 24 is a schematic block diagram illustrating an exemplary embodiment in accordance with principles of inventive concepts of data processing systems including semiconductor memory devices in accordance with principles of inventive concepts.

FIG. 24 is a schematic block diagram illustrating an exemplary embodiment of a data processing system including semiconductor memory devices in accordance with principles of inventive concepts. Flash memory system 1310 according to embodiments of the inventive concept is installed in a data processing system such as a mobile device or a desk top computer. Flash memory system 1310 includes memory controller 1312 and flash memory 1310. Data processing system 1300 in accordance with principles of inventive concepts includes modulator-demodulator (MODEM) 1320, central processing unit (CPU) 1330, random access memory (RAM) device 1340 and user interface unit 1350 that are electrically connected to flash memory system 1310 through data bus 760. Flash memory system 1310 may have substantially the same configuration as the memory system or the flash memory system described above. Memory system 1310 may store data processed by CPU 1330 or data transmitted from an external system. Flash memory system 1310 may be realized as a solid state drive (SSD), for example. In such an implementation, information processing system 1300 may stably and reliably store bulk data in memory system 1310. Additionally, due to improved reliability of embodiments in accordance with principles of inventive concepts, flash memory system 1310 may reduce a requirements for correcting errors to provide data communication of high speed to data process system 1300. Although not shown in the drawings, data processing system 1300 may include an application chipset, a camera image processor (CIS), and/or an input/output unit, for example.

Flash memory devices or memory systems in accordance with principles of inventive concepts may be encapsulated using various packaging techniques. For example, they may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and a wafer-level processed stack package (WSP) technique.

In a semiconductor device in accordance with principles of inventive concepts, the device isolation structure includes a gap region. The dielectric constant of the vacuum, or the gas/air, in the gap region is much lower than the dielectric constant of an oxide layer. As a result, coupling, such as capacitive coupling, between adjacent cells, and the attendant signal interference between cells may be significantly reduced.

While the inventive concept has been described with reference to example embodiments, various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A semiconductor memory device, comprising:
a semiconductor substrate having a plurality of active regions defined by a trench extending in a first direction;
a gate electrode crossing the plurality of active regions;
a plurality of data storage structures between the gate electrode and each of the plurality of active regions;
a blocking insulating layer between the gate electrode and the data storage structures; and
a device isolation structure disposed in the trench, the device isolation structure including a lower insulating pattern, an upper insulating pattern, and a gap region between the lower insulating pattern and the upper insulating pattern,
wherein the gap region extends along the first direction, and
wherein an upper surface of the lower insulating pattern is lower than lower surfaces of the data storage structures, and a lower surface of the upper insulating pattern is disposed between the lower surfaces of the data storage structures and upper surfaces of the data storage structures.

2. The semiconductor device of claim 1, wherein each of the plurality of active regions includes a tunnel insulating layer and a floating gate pattern on the tunnel insulating layer.

3. The semiconductor device of claim 2, wherein the lower surface of the upper insulating pattern is higher than an upper surface of the tunnel insulating layer and lower than an upper surface of the floating gate pattern.

4. The semiconductor device of claim 2, wherein the upper insulating pattern includes a filling insulating recess pattern and spacer recess patterns positioned on both sidewalls of the filling insulating recess pattern.

5. The semiconductor device of claim 4, wherein a bottom surface of the filling insulating recess pattern is higher than a bottom surface of the floating gate pattern.

6. The semiconductor device of claim 4, wherein a top surface of the filling insulating recess pattern is substantially coplanar with a top surface of the spacer recess pattern.

7. The semiconductor device of claim 1, wherein an upper surface of the upper insulating pattern is lower than the upper surfaces of the data storage structures.

8. The semiconductor device of claim 1, wherein the blocking insulating layer extends to an upper surface of the upper insulating pattern.

9. The semiconductor device of claim 1, wherein the gap region is disposed between the data storage structures adjacent to each other.

10. The semiconductor device of claim 1, wherein portions of the data storage structures are exposed by the gap region.

* * * * *